US012576711B2

(12) United States Patent
Nakamura

(10) Patent No.: US 12,576,711 B2
(45) Date of Patent: Mar. 17, 2026

(54) STEERING DEVICE

(71) Applicant: HONDA MOTOR CO., LTD., Tokyo (JP)

(72) Inventor: Kotaro Nakamura, Tokyo (JP)

(73) Assignee: HONDA MOTOR CO., LTD, Tokyo (JP)

( * ) Notice: Subject to any disclaimer, the term of this patent is extended or adjusted under 35 U.S.C. 154(b) by 181 days.

(21) Appl. No.: 18/523,915

(22) Filed: Nov. 30, 2023

(65) Prior Publication Data

US 2024/0182102 A1    Jun. 6, 2024

(51) Int. Cl.
B60K 35/10 (2024.01)
B60K 35/60 (2024.01)
(Continued)

(52) U.S. Cl.
CPC .............. B60K 35/10 (2024.01); B62D 1/046 (2013.01); H03K 17/955 (2013.01); B60K 35/60 (2024.01);
(Continued)

(58) Field of Classification Search
CPC ........ G01R 27/00; G01R 27/02; G01R 27/26; G01R 27/2605; G01D 5/00; G01D 5/12; G01D 5/14; G01D 5/24; B60K 35/00; B60K 35/10; B60K 2360/00; B60K 2360/143; B60K 2360/40; B60K 2360/48; B60K 2360/77; B60K 35/60; B60K 2360/782;
(Continued)

(56) References Cited

U.S. PATENT DOCUMENTS 10,773,743 B2 * 9/2020 Park ..................... B62D 15/025
11,150,113 B2 * 10/2021 Kunieda ................ G01D 5/241
(Continued)

FOREIGN PATENT DOCUMENTS

JP      2009265851 A     11/2009
JP      2012043275 A     3/2012
(Continued)

OTHER PUBLICATIONS

Notification of Reasons for Refusal issued Sep. 17, 2024 in the JP Patent Application No. 2022-193749.

*Primary Examiner* — Hoai-An D. Nguyen
(74) *Attorney, Agent, or Firm* — CKC & PARTNERS CO., LLC

(57)                ABSTRACT
A steering device includes: a plurality of proximity sensors having different installation positions of electrodes on the steering wheel; and a grip determination device which determines the presence/absence of gripping of the steering wheel based on filter values Ch_R_f(n), Ch_L_f(n) of measurement values from the plurality of proximity sensors. The grip determination device includes: a capacitance threshold setter which sets a reference value Ch_0 relative to the electrostatic capacitance of the electrode; and a determiner which determines the presence/absence of gripping based on the difference between the measurement values Ch_R_d(n), Ch_L_d(n) and the reference value Ch_0. The capacitance threshold setter determines the necessity for correction of the reference value Ch_0 based on a degree of similarity in change trends of the filter values Ch_R_f(n), Ch_L_f(n) of the plurality of proximity sensors.

13 Claims, 4 Drawing Sheets

(51) Int. Cl.
  *B62D 1/04* (2006.01)
  *H03K 17/955* (2006.01)
(52) U.S. Cl.
  CPC .... *B60K 2360/143* (2024.01); *B60K 2360/48* (2024.01); *B60K 2360/782* (2024.01)
(58) Field of Classification Search
  CPC ... B62D 1/00; B62D 1/02; B62D 1/04; B62D 1/046; B62D 1/06; B60W 40/00; B60W 40/08; B60W 2420/00; B60W 40/09; B60W 2420/24; H03K 17/00; H03K 17/94; H03K 17/955
  USPC .................................. 324/600, 649, 658, 686
  See application file for complete search history.

(56) References Cited

U.S. PATENT DOCUMENTS

| | | | |
|---|---|---|---|
| 2009/0267922 | A1 | 10/2009 | Umeda |
| 2012/0044013 | A1 | 2/2012 | Muranaka |
| 2017/0129499 | A1 | 5/2017 | Odate |
| 2018/0087929 | A1 | 3/2018 | Matsumura |
| 2020/0298881 | A1 | 9/2020 | Odate et al. |
| 2021/0206230 | A1 | 7/2021 | Ishikawa |
| 2023/0227093 | A1* | 7/2023 | Takahata ................ G01V 3/088 324/672 |

FOREIGN PATENT DOCUMENTS

| | | | | |
|---|---|---|---|---|
| JP | 5009473 | B2 | 8/2012 | |
| JP | 2017087883 | A | 5/2017 | |
| JP | 2017182318 | A | 10/2017 | |
| JP | 2018047816 | A | 3/2018 | |
| JP | 2018075849 | A | 5/2018 | |
| JP | 2018120757 | A | 8/2018 | |
| JP | 2020060313 | A | 4/2020 | |
| JP | 2023104270 | A * | 7/2023 | ............. G01N 27/22 |
| WO | 2017168540 | A1 | 10/2017 | |

* cited by examiner

FIG. 2

STEERING DEVICE

This application is based on and claims the benefit of priority from Japanese Patent Application No. 2022-193749, filed on 2 Dec. 2022, the content of which is incorporated herein by reference.

BACKGROUND OF THE INVENTION

Field of the Invention

The present invention relates to a steering device. In more detail, it relates to a steering device including a steering wheel, and a grip determination device which determines the presence/absence of gripping of the steering wheel by a driver.

Related Art

In recent years, the equipping to vehicles of driving assistance devices which assist driving of a vehicle by the driver, such as a lane maintaining function, lane deviation suppressing function, lane change function and preceding vehicle following function has been advancing. With a vehicle equipped with such driving assistance devices, for example, in a case of determining the presence/absence of gripping of the steering wheel by the driver by way of a grip determination device such as that shown in Patent Document 1, and determining as not being gripped, gripping of the steering wheel may be prompted to the driver, or the driving assistance function may be cancelled while traveling.

With the grip determination device shown in Patent Document 1, the presence/absence of gripping of the steering wheel by the driver is determined based on a comparison between the output value of an electrostatic capacitance sensor provided to the steering wheel and a predetermined threshold.

Patent Document 1: Japanese Unexamined Patent Application, Publication No. 2017-87883

SUMMARY OF THE INVENTION

However, the output value of the electrostatic capacitance sensor varies according to the temperature around the steering wheel. For this reason, in the case of fixing the threshold irrespective of the change in environmental state around the steering wheel, there is a risk of misjudgment. Therefore, with the invention disclosed in Patent Document 1, the threshold for the output value of the electrostatic capacitance sensor changes based on the detection value or estimated value for the ambient temperature of the steering wheel.

However, with the invention shown in Patent Document 1, it is necessary to also provide a temperature sensor in addition to the electrostatic capacitance sensor. In addition, the output value of the electrostatic capacitance sensor varies also according to the humidity, not only the temperature of the surroundings. For this reason, in order to also consider the humidity of the surroundings, a humidity sensor also becomes necessary in addition to the temperature sensor.

The present invention has an object of providing a steering device which can prevent misjudgment due to a change in environmental state around the steering wheel by a simple configuration, and thus has an object of contributing to the development of a sustainable transportation system.

A steering device (for example, the steering device 1 described later) according to a first aspect of the present invention includes: a steering wheel (for example, the steering wheel 2 described later) which accepts a steering operation of a vehicle from a driver; a measurement device (for example, the measurement circuits 42, 52 described later) which measures an electrostatic capacitance of an electrode (for example, the electrodes 40, 50 described later) provided to the steering wheel; a plurality of the measurement devices having different installation positions of the electrodes; and a grip determination device (for example, the grip determination device 80 described later) which determines a presence/absence of gripping of the steering wheel based on a measurement value (for example, the measurement values Ch_R_d(n), Ch_L_d(n) and filter values Ch_R_f(n), Ch_L_f(n) thereof described later) from a plurality of the measurement devices, in which a detection target region is established for every one of the measurement devices on the steering wheel, the grip determination device includes a capacitance threshold setter (for example, the capacitance threshold setter 82 described later) which sets a capacitance threshold (for example, the reference value Ch_0 or grip determination threshold Ch_th described later) for electrostatic capacitance of the electrode, and a determiner (for example, the determiner 81 described later) which determines a presence/absence of gripping for every one of the detection target regions based on a difference or comparison between the measurement value and the capacitance threshold, and in which the capacitance threshold setter determines a necessity for correction of the capacitance threshold based on a degree of similarity in change trends of measurement values of the plurality of the measurement devices.

According to a second aspect of the present invention, in this case, it is preferable for the capacitance threshold setter to calculate a similarity (for example, the similarity S(n) described later) which fluctuates in response to the degree of similarity, and correct the capacitance threshold in a case of the similarity being higher than a predetermined similarity reference (for example, the similarity reference S_th described later), and maintain the capacitance threshold constant, in a case of the similarity being lower than the similarity reference.

According to a third aspect of the present invention, in this case, it is preferable for the capacitance threshold setter to calculate the similarity by comparing a slope (for example, the slopes a_R(n), a_L(n) described later) of each measurement value of a plurality of the measurement devices.

According to a fourth aspect of the present invention, in this case, it is preferable for the capacitance threshold setter to calculate the similarity by comparing a change amount (for example, the change amounts dCh_R_f(n), dCh_L_f(n) described later) in a predetermined determination period of each measurement value of a plurality of the measurement devices.

According to a fifth aspect of the present invention, in this case, it is preferable for the capacitance threshold setter to correct the capacitance threshold to an increasing side in a case of all measurement values of a plurality of the measurement devices being an increasing trend, and correct the capacitance threshold to a decreasing side in a case of all measurement values of a plurality of the measurement devices being a decreasing trend.

According to a sixth aspect of the present invention, in this case, it is preferable for the determiner to determine a presence/absence of gripping of the steering wheel based on a capacitance differential value (for example, the capacitance differential values ΔCh_R, ΔCh_L described later) obtained by subtracting a reference value (for example, the reference value Ch_0 described later) which is the capacitance threshold from the measurement value.

According to a seventh aspect of the present invention, in this case, it is preferable for the determiner to determine a presence/absence of gripping of the steering wheel by comparing between the measurement value and a grip determination threshold (for example, the grip determination threshold Ch_th described later) which is the capacitance threshold.

In the steering device according to the first aspect of the present invention, the grip determination device includes the plurality of measurement devices for electrostatic capacitance having different installation positions of the electrodes on the steering wheel; and the grip determination device which determines the presence/absence of gripping of the steering wheel based on the measurement values from the plurality of measurement devices. In addition, the detection target regions are established for every measurement device on the steering wheel, and the grip determination device includes the capacitance threshold setter which sets capacitance threshold for the electrostatic capacitance of the electrode; and the determiner which determines the presence/absence of gripping for every detection target region based on the difference or comparison between the measure values and the capacitance threshold. Herein, when the driver grips the steering wheel at any of the plurality of detection target regions, the measurement value of the measurement device establishing this gripped region as the detection target region increases, and thus the difference between the measurement value and the capacitance threshold also increases. For this reason, the steering device can determine the presence/absence of gripping for every detection target region based on the difference or comparison between the measurement value and the capacitance threshold. Herein, when the environmental state around the steering wheel changes, since the measurement values of the electrostatic capacitance from these measurement devices also change, it is necessary to appropriately correct the capacitance threshold according to the change in environmental state in order to suppress misjudgment caused by the change in environmental state. In addition, since the plurality of electrodes are under substantially the same environment, the change trends of the measurement values of the respective measurement devices due to a change in environmental state will be similar. Therefore, the capacitance threshold setter can correct the capacitance threshold at the appropriate timing, by dividing the cause for change in the measurement values into being due to change in the position of the hand of the driver and due to change in environmental state, by determining the necessity for correction of the capacitance threshold based on the degree of similarity in the change trends of the measurement values of the plurality of measurement devices. Consequently, according to the present invention, since it is possible to make the difference between the measurement value and capacitance threshold constant irrespective of the change in environmental state around the steering wheel, it is possible to prevent misjudgment due to variation in the environmental state around the steering wheel, and thus it is possible to contribute to the development of a sustainable transportation system. In addition, with the present invention, since there is no need to provide a sensor for detecting the environmental state around the steering wheel, it is possible to prevent misjudgment with a simpler configuration than conventional.

According to the second aspect of the present invention, the capacitance threshold setter calculates the similarity which varies according to the degree of similarity, and in the case of this similarity being higher than the similarity reference, i.e. case of the change trends of each measurement value of the plurality of measurement devices being similar, corrects the capacitance threshold with the change in these measurement values as being due to change in the environmental state, and in the case of the similarity being lower than the similarity reference, maintains the capacitance threshold constant with the change in these measurement values as being due to the position of the hand of the driver changing. Consequently, according to the present invention, since it is possible to remove only the variation amount due to the change in environmental state from the difference between the measurement value and capacitance threshold, it is possible to prevent misjudgment due to variation in the environmental state around the steering wheel.

According to the third aspect of the present invention, the capacitance threshold setter calculates the similarity by comparing the slopes of each measurement value of the plurality of measurement devices. Consequently, according to the present invention, it is possible to calculate the similarity in change trends of each measurement value by a simple computation.

According to the fourth aspect of the present invention, the capacitance threshold setter calculates the similarity by comparing the change amounts in a predetermined determination period of each measurement value of the plurality of measurement devices. Consequently, according to the present invention, it is possible to calculate the similarity in change trends of each measurement value by a simple computation.

According to the fifth aspect of the present invention, the capacitance threshold setter corrects the capacitance threshold to the increasing side, in the case of the similarity of change trends of the plurality of measurement values being higher than the similarity reference, and all of the plurality of measurement values being an increasing trend, and corrects the capacitance threshold to the decreasing side in the case of the similarity of change trends of the plurality of measurement values being higher than the similarity reference S_th, and all of the plurality of measurement values being a decreasing trend. Since it is thereby possible to make the difference between the measurement values and capacitance threshold constant irrespective of the change in environmental state, it is possible to prevent misjudgment.

In the sixth aspect of the present invention, the determiner determines the presence/absence of gripping of the steering wheel based on the capacitance differential value obtained by subtracting the reference value which is the capacitance threshold from the measurement value. Consequently, according to the present invention, since it is possible to make the capacitance differential value constant irrespective of the change in environmental state around the steering wheel, it is possible to determine the presence/absence of gripping precisely.

In the seventh aspect of the present invention, the determiner determines the presence/absence of gripping of the steering wheel by comparing between the measurement value and the grip determination threshold which is the capacitance threshold. Consequently, according to the present invention, since it is possible to make the difference between the capacitance differential value and the grip determination threshold constant irrespective of the change in environmental state around the steering wheel, it is possible to determine the presence/absence of gripping precisely.

BRIEF DESCRIPTION OF THE DRAWINGS

FIG. 2 is a view showing a circuit configuration of a right measurement circuit;

DETAILED DESCRIPTION OF THE INVENTION

Hereinafter, a steering device according to an embodiment of the present invention will be explained while referencing the drawings.

Figure 1:
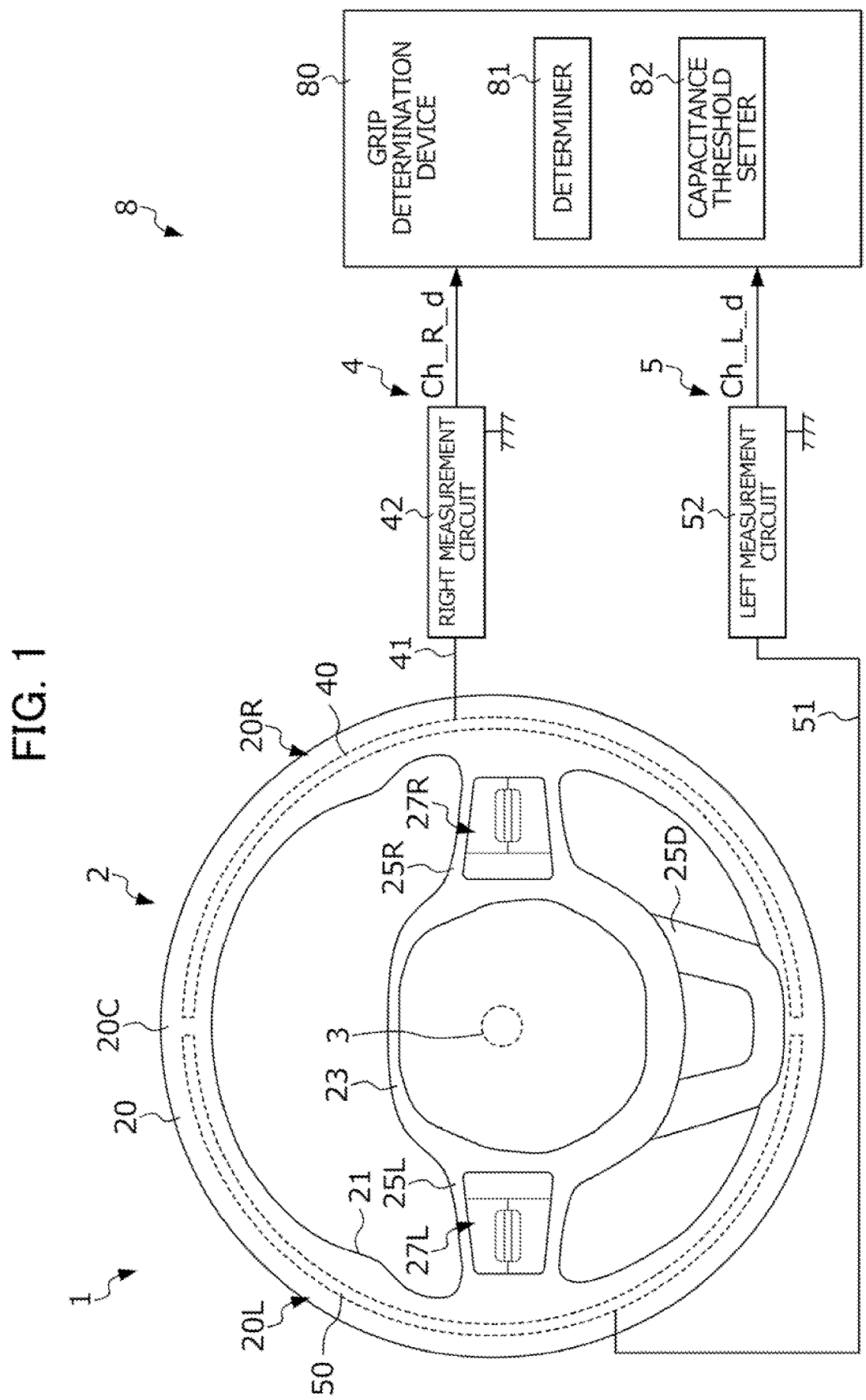
FIG. 1 is a view showing the configuration of a steering device according to an embodiment of the present invention.

FIG. 1 is a view showing the configuration of a steering device 1 according to the present embodiment. The steering device 1 is equipped to a vehicle (not shown). The steering device 1 includes: a steering wheel 2 which accepts steering operation of the vehicle by the driver and auxiliary device operation related to a vehicle auxiliary device; a steering shaft 3 that pivotally supports this steering wheel 2; a grip sensor unit 8 which determines the presence/absence of gripping of the steering wheel 2 by the driver based on the measurement result for electrostatic capacitance of the plurality of electrodes provided to the steering wheel 2.

The steering wheel 2 includes a rim part 20 which can be gripped by the driver and is annular; a hub part 23 provided on the inner side of this rim part 20; and three spokes 25L, 25R, 25D connected to a rim inner circumferential part 21 of the rim part 20 extending along the radial direction from the hub part 23.

The hub part 23 is cylindrical, is provided at the center of the rim part 20 viewed from the driver, for example, and configures a center of the steering wheel 2. At a back side of the hub part 23 viewed from the driver, a steering shaft 3 which pivotally supports the steering wheel 2 is coupled. The steering shaft 3 is a rod-like coupling member which couples a core, which is the backbone of the hub part 23, and a steering mechanism which constitutes part of the vehicle frame which is not shown. Therefore, the steering torque generated by the driver rotating the steering wheel 2 is transferred to the steering mechanism, which is not shown, by this steering shaft 3.

The rim part 20 and hub part 23 are connected by the three spokes 25L, 25R, 25D. The left spoke part 25L extends along the horizontal direction, and connects a portion on the left side of the hub part 23 viewed from the driver, and a portion on the right side of the rim inner circumferential part 21 viewed from the driver. The right sport part 25R extends in parallel with the left spoke part 25L along the horizontal direction, and connects a portion on the right side of the hub part 23 viewed from the driver, and a portion on the right side of the rim inner circumferential direction 21 viewed from the driver. The lower spoke part 25D extends perpendicular to the spokes 25L, 25R along the vertical direction, and connects a portion on the lower part of the hub part 23 viewed from the driver, and a portion on a lower part of the rim inner circumferential part 21 viewed from the driver.

In the above way, the rim part 20 is annular viewed from the driver, and the driver can grip over the entire circumference thereof. In addition, the plurality (two in the example of FIG. 1) of electrodes 40, 50 of the grip sensor unit 8 described later are provided to this rim part 20. It should be noted that the present embodiment explains a case of providing a plurality of electrodes 40, 50 to the rim part 20 of the steering wheel 2; however, the present invention is not limited thereto. A plurality of electrodes may be provided to the hub part 23 or spokes 25L, 25R, 25D in addition to the rim part 20. In addition, the present embodiment explains a case of providing the two electrodes 40, 50 to the steering wheel 2; however, the present invention is not limited thereto. The number of electrodes provided to the steering wheel 2 may be three or more.

At the left spoke part 25L and right spoke part 25R, a left auxiliary device operation control unit 27L and a right auxiliary device operation control unit 27R which accept auxiliary device operations from the driver in order for the driver to operate vehicle auxiliary devices, which are not shown (for example, audio deice, car navigation device, etc.), are provided. The driver becomes able to operate the vehicle auxiliary devices by operating a plurality of switches provided to these auxiliary device operation control units 27L, 27R by finger.

It should be noted that, hereinafter, the positions of the substantially circular rim part 20, rim inner circumferential part 21, hub part 23 and steering shaft 3, and orientations of each spoke part 25L, 25R, 25D viewed from the driver may be represented by a clock-wise angle "°" centering around the steering shaft 3, and with the upper end part 20C of the rim part 20 viewed from the driver as a reference. In other words, the right spoke part 25R extends along the orientation of 90°, and connects a 90° portion of the hub part 23 and rim inner circumferential part 21. The lower spoke part 25D extends along an orientation of 180°, and connects a 180° portion of the hub part 23 and rim inner circumferential part 21. In addition, the left spoke part 25L extends along the orientation of 270°, and connects a 270° portion of the hub part 23 and rim inner circumferential part 21.

The grip sensor unit 8 includes: a plurality (two in the present embodiment) of proximity sensors 4, 5, having respectively different detection target regions, and a grip determination device 80 which determines the presence/absence of gripping of the steering wheel 2 by the driver and the grip positions based on the measurement results from these proximity sensors 4 and 5.

The right proximity sensor 4 includes a right electrode 40 provided to the rim part 20, and a right measurement circuit 42 electrically connected with this right electrode 40. The right electrode 40 is a circular arc shape extending along the rim part 20, and is electrically conductive. The right electrode 40 is provided inside of the rim part 20. The right electrode 40 is arranged in a range of about 180° between 0° and 180° of the rim part 20 (i.e. range which can be gripped mainly by the right hand of the driver while going straight). It should be noted that, hereinafter, the region of the rim part 20 in which the right electrode 40 is arranged is also referred to as right grip 20R. The right measurement circuit 42 is connected with the right electrode 40 via a wire 41. The right measurement circuit 42 measures electrostatic capacitance between the right electrode 40 and ground, as a value which fluctuates according to the distance between the arrangement position of the right electrode 40 and the human body. As the distance between the arrangement position of the right electrode 40 and human body narrows, the electrostatic capacitance between the right electrode 40 and ground becomes larger. A measurement value $Ch\_R\_d$ of electrostatic capacitance by the right measurement circuit 42 is sent to the grip determination device 80.

Figure 2:
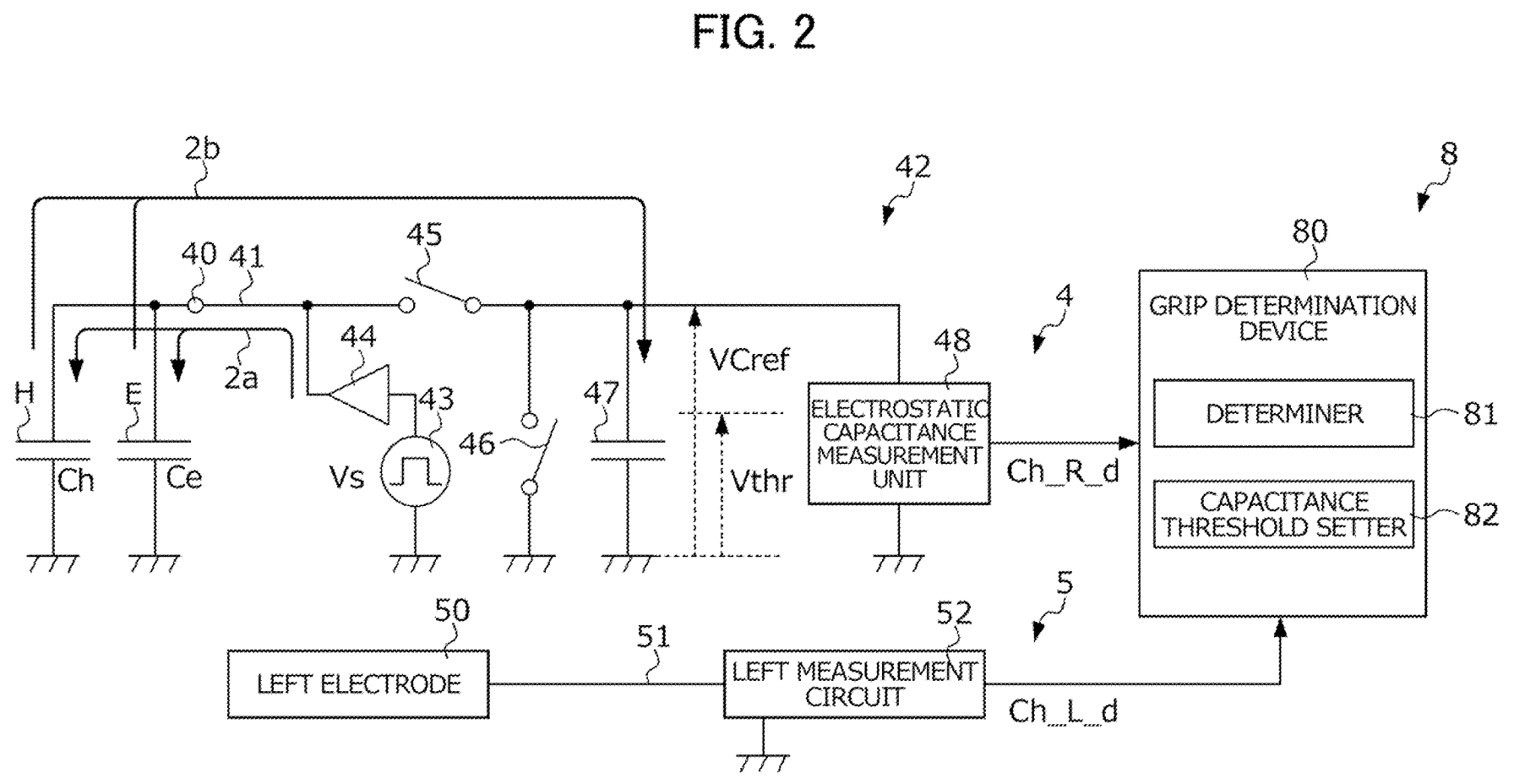

FIG. 2 is a view showing the circuit configuration of the right measurement circuit 42. The right measurement circuit 42 includes a pulse power source 43, amplifier 44, first switch 45, second switch 46, charge capacitor 47, and electrostatic capacitance measurement unit 48. It should be noted that FIG. 2 illustrates the electrostatic capacitance between the right electrode 40 and ground (for example, vehicle frame) to be divided into electrostatic capacitance Ch formed by the human body H including the hands of the driver operating the steering wheel 2, and the stray capacitance Ce formed by a floating capacitor E of wires, components, etc. excluding the human body H.

As shown in FIG. 2, the pulse power source 43 and amplifier 44 are connected in series. The second switch 46 and charge capacitor 47 are connected in parallel. A series circuit made from the pulse power source 43 and amplifier 44, and the parallel circuit made from the second switch 46 and charging capacitor 47 are connected via the first switch 45. An output terminal of the amplifier 44 and the first switch 45 are connected to the right electrode 40 via the wire 41. Therefore, the pulse power source 43 is connected to the right electrode 40 via the amplifier 44 and wire 41. In addition, the second switch 46 and charge capacitor 47 are connected to the right electrode 40 respectively via the first switch 45 and wire 41.

The pulse power source 43 supplies a pulse voltage Vs of predetermined frequency and predetermined voltage to the amplifier 44, in response to a command from the grip determination device 80. The amplifier 44 amplifies the pulse voltage Vs supplied from the pulse power source 43, and applies it to the right electrode 40.

The second switch 46 is a switching element which is turned ON/OFF by a drive circuit which is not illustrated. The drive circuit of this second switch 46 turns OFF the second switch 46 until the voltage VCref of the charge capacitor 47 reaches the threshold Vthr decided in advance, and turns ON the second switch 46 after the voltage VCref reaches the threshold Vthr, and discharges the charge stored in the charge capacitor 47.

The first switch 45 is a switching element which is turned ON/OFF by a drive circuit which is not illustrated. The drive circuit of this first switch 45 turns OFF the first switch 45 in response to rising of the pulse voltage Vs of the pulse power source 43. The pulse voltage supplied from the pulse power source 43 and amplifier 44 is applied to the right electrode 40, the charge migrates through the path shown by the arrow 2a in FIG. 2, and the human body H and floating capacitor E are thereby charged.

In addition, the drive circuit of the first switch 45 turns ON the first switch 45 in response to rising of the pulse voltage Vs of the pulse power source 43. The human body H and floating capacitor E and the charge capacitor 47 are thereby connected, charge migrates through the path shown by the arrow 2b in FIG. 2 from the human body H and floating capacitor E to the charge capacitor 47, and the charge capacitor 47 is charged. The voltage VCref of the charge capacitor 47 thereby rises.

For this reason, when applying the pulse voltage to the right electrode 40 by the pulse power source 43 and amplifier 44, charge and discharge of the human body H and floating capacitor E is alternately repeated, and the voltage VCref of the charge capacitor 47 gradually increases. At this time, the time until the voltage VCref of the charge capacitor 47 reaches the threshold Vthr (or pulse number of the pulse power source 43) varies according to the static capacitance Ch formed by the human body H, i.e. distance between the right electrode 40 and body of the driver. In other words, in the case of part of the body of the driver contacting or approaching the arrangement position of the right electrode 40 on the rim part 20, and the static capacitance Ch rising, the time taken until the voltage VCref of the charge capacitor 47 reaches the threshold Vthr shortens, and in the case of part of the body of the driver distancing from the arrangement position of the right electrode 40 and the static capacitance Ch lowering, the time taken until the voltage VCref of the charge capacitor 47 reaches the threshold Vthr lengthens.

The static capacitance measurement unit 48 measures the time and pulse number until the voltage VCref of the charge capacitor 47 reaches the threshold Vthr, and measures the static capacitance Ch formed by the human body H existing in the vicinity of the right electrode 40 indirectly based on this measurement result. The static capacitance measurement unit 48 sends a measurement value Ch_R of the static capacitance Ch obtained by the above sequence to the grip determination device 80.

The left proximity sensor 5 includes a left electrode 50 provided to the rim part 20, and a left measurement circuit 52 electrically connected with this left electrode 50. The left electrode 50 is a circular arc shape extending along the rim part 20, and is electrically conductive. The left electrode 50 is provided inside of the rim part 20. The left electrode 50 is arranged in the range of about 180° between 180° and 360° of the rim part 20 (i.e. range grippable mainly by the left hand of the driver while going straight). It should be noted that the region of the rim part 20 in which the left electrode 50 is arranged is also referred to as left grip 20L below. The left measurement circuit 52 is connected with the left electrode 50 via the wire 51. The left measurement circuit 52 measures the static capacitance between the left electrode 50 and ground, as a value which varies according to the distance between the arrangement position of the left electrode 50 and the human body. As the distance between the arrangement position of the left electrode 50 and the human body approaches, the electrostatic capacitance between the left electrode 50 and ground increases. The measurement value Ch_L_d of the static capacitance by the left detection circuit 52 is sent to the grip determination device 80. It should be noted that the circuit configuration of the left measurement circuit 52 is substantially the same as the circuit configuration of the right measurement circuit 42 explained by referencing FIG. 2, and thus detailed explanation thereof is omitted.

In the above way, the right electrode 40 of the right proximity sensor 4 is provided at a position closer to the right grip 20R than the other electrode 50. For this reason, the right proximity sensor 4 defines the right grip 20R of the rim part 20 as a detection target region. The left electrode 50 of the left proximity sensor 5 is provided at a position closer to the left grip 20L than the other electrode 40. For this reason, the left proximity sensor 5 defines the left grip 20L of the rim part 20 as the detection target region. In the above way, a detection target region is established for every proximity sensor 4, 5 on the rim part 20 of the steering wheel 2. The grip determination device 80 acquires the presence/absence of gripping of the rim part 20 by the driver and the gripping position, based on each of the measurement values Ch_R_d, Ch_L_d of the two proximity sensors 4 and 5 having different detection target regions on the rim part 20 as mentioned above.

The grip determination device 80 includes a determiner 81 which determines, for every detection target region, the presence/absence of gripping by the driver based on a difference or comparison between the measurement value Ch_R, Ch_L_d of each proximity sensor 4, 5 and capacitance threshold related to the electrostatic capacitance such as the reference value Ch_0 or the grip determination threshold Ch_th; and a capacitance threshold setter 82 which sequentially sets the capacitance threshold referenced upon determining the presence/absence of gripping in the determiner 81 based on the measurement values Ch_R_d, Ch_L_d.

The determiner 81 determines the presence/absence of gripping of the right grip 20R which is set as the detection target region by the right proximity sensor 4, on the steering wheel 2, by calculating the capacitance differential value ΔCh_R by subtracting the reference value Ch_0 from the measurement value Ch_R_d of the right proximity sensor 4, and further comparing the magnitudes of this capacitance differential value ΔCh_R and the grip determination threshold Ch_th. More specifically, the determiner 81 determines that the steering wheel 2 is being gripped by the driver at the right grip 20R of the rim part 20, in the case of the difference between the capacitance differential value ΔCh_R and the grip determination threshold Ch_Th (ΔCh_R−Ch_th) being 0 or positive, i.e. case of the following Formula (1-1) holding true. In addition, the determiner 81 determines that the steering wheel 2 is not being gripped by the driver at the right grip 20R of the rim part 20, in the case of the difference between the capacitance differential value ΔCh_R and the grip determination threshold Ch_Th (ΔCh_R−Ch_th) being negative, i.e. case of the following Formula (1-2) holding true.

$$Ch\_R\_d-Ch\_0 \geq Ch\_th \qquad (1\text{-}1)$$

$$Ch\_R\_d-Ch\_0 < Ch\_th \qquad (1\text{-}2)$$

The determiner 81 determines the presence/absence of gripping of the left grip 20L which is set as the detection target region by the left proximity sensor 5, on the steering wheel 2, by calculating the capacitance differential value ΔCh_L by subtracting the reference value Ch_0 from the measurement value Ch_L_d of the left proximity sensor 5, and further comparing the magnitudes of this capacitance differential value ΔCh_L and the grip determination threshold Ch_th. More specifically, the determiner 81 determines that the steering wheel 2 is being gripped by the driver at the left grip 20L of the rim part 20, in the case of the difference between the capacitance differential value ΔCh_L and the grip determination threshold Ch_Th (ΔCh_L−Ch_th) being 0 or positive, i.e. case of the following Formula (2-1) holding true. In addition, the determiner 81 determines that the steering wheel 2 is not being gripped by the driver at the left grip 20L of the rim part 20, in the case of the difference between the capacitance differential value ΔCh_L and the grip determination threshold Ch_Th (ΔCh_L−Ch_th) being negative, i.e. case of the following Formula (2-2) holding true.

$$Ch\_L\_d-Ch\_0 \geq Ch\_th \qquad (2\text{-}1)$$

$$Ch\_L\_d-Ch\_0 < Ch\_th \qquad (2\text{-}2)$$

Herein, reference value Ch_0 corresponds to a value for the electrostatic capacitance of the electrodes 40, 50 when the hand of the driver is present at a position sufficiently distanced from the installation position of the electrodes 40, 50 of the steering wheel 2. Therefore, the capacitance differential values ΔCh_R (=Ch_R_d−Ch_0) and ΔCh_L (=Ch_L_d−Ch_0) increase as the hand of the driver approaches the installation position of the electrodes 40, 50. A fixed value decided in advance or a value sequentially set by the capacitance threshold setter 82 can be used as this reference value Ch_0.

In addition, grip determination threshold Ch_th is a threshold set for the capacitance differential values ΔCh_R, ΔCh_L for determining whether the hand of the driver is sufficiently close to the installation position of the electrodes 40, 50, i.e. whether the driver is gripping the steering wheel 2, and is a positive value. A fixed value decided in advance or a value sequentially set by the capacitance threshold setter 82 can be used as this grip determination threshold Ch_th.

Herein, each measurement value Ch_R_d, Ch_L_d and capacitance differential value ΔCh_R, ΔCh_L varies not only by the distance between the hand of the driver and the installation position of each electrode 40, 50, but also the environmental state such as the temperature and humidity around the installation position of each electrode 40, 50. More specifically, each measurement value Ch_R_d, Ch_L_d and capacitance differential value ΔCh_R, ΔCh_L has a tendency of increasing as the temperature rises, and increasing as the humidity rises. For this reason, when setting the capacitance threshold such as the reference value Ch_0 or the grip determination threshold Ch_th as a fixed value independent of the change in environmental state, there is concern over the determiner 81 misjudging. Therefore, the capacitance threshold setter 82 changes both or either of the reference value Ch_0 and grip determination threshold Ch_th according to variation in environmental state. It should be noted that, although the present embodiment explains a case of the capacitance threshold setter 82 varying the reference value Ch_0 according to variations in environmental state and making the grip determination threshold Ch_th as a fixed value, the present invention is not limited thereto.

Figure 3:
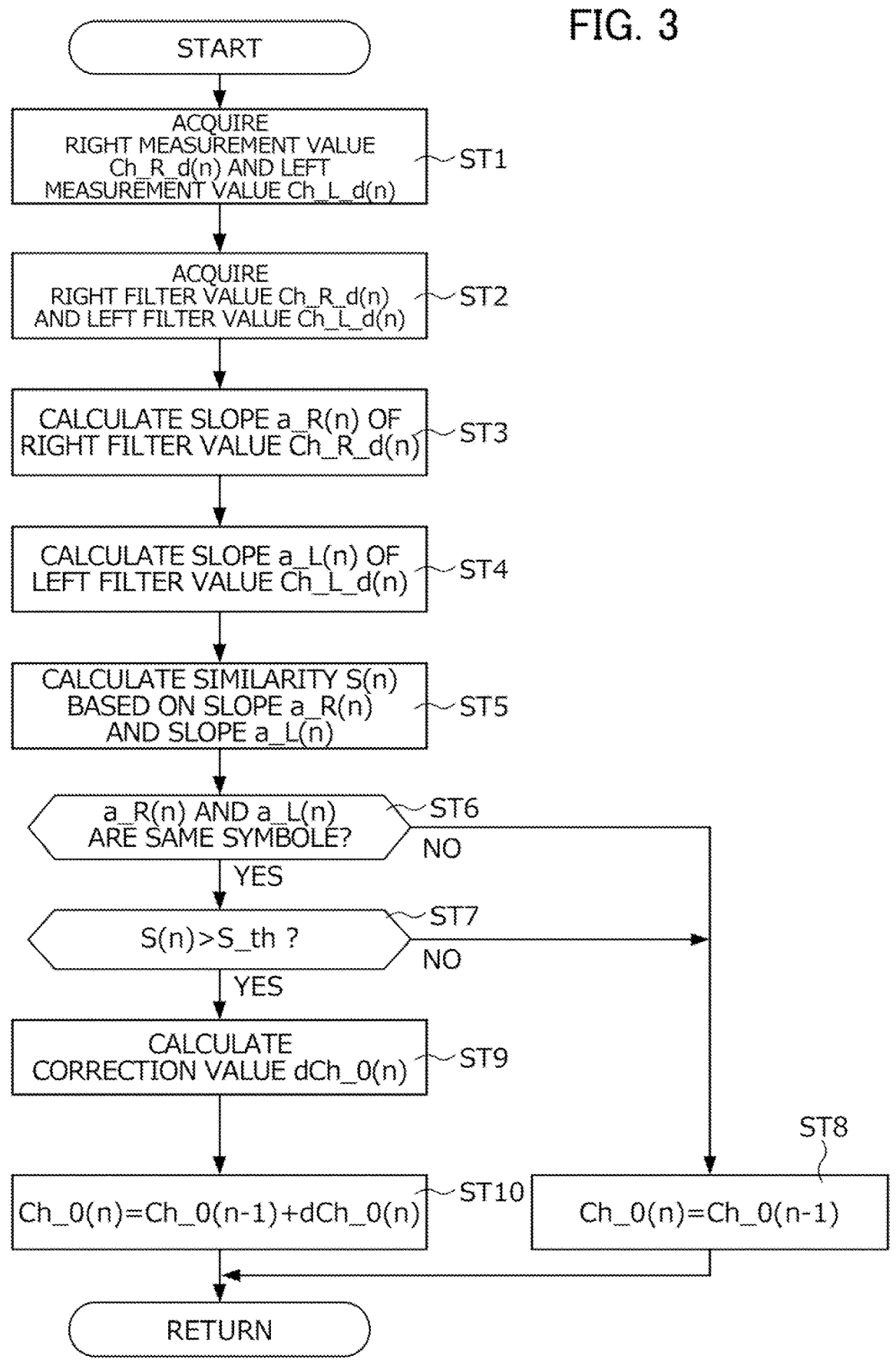
FIG. 3 is a flowchart showing a specific sequence of reference value setting processing of setting a reference value.

FIG. 3 is a flowchart showing a specific sequence of reference value setting processing of setting the reference value Ch_0. The reference value setting processing shown in FIG. 3 is repeatedly executed every predetermined control cycle Δt in the capacitance threshold setter 82.

First, in Step ST1, the capacitance threshold setter 82 acquires the right measurement value Ch_R_d(n) of electrostatic capacitance of the right electrode 40 from the right proximity sensor 4 and the left measurement value Ch_L_d (n) of electrostatic capacitance of the left electrode 50 from the left proximity sensor 5, and then advances to Step ST2. Herein, the symbol (n) is a symbol indicating the discretized time, and indicates being data acquired or calculated by processing in the n$^{th}$ control cycle. In other words, in the case of the symbol (n) being data acquired or calculated in a current control timing, the symbol (n−1) indicates data acquired or calculated in the previous control timing (i.e. before Δt). It should be noted that, in the following explanation, the symbol (n) indicating time is omitted as appropriate.

In Step ST2, the capacitance threshold setter 82 conducts filter processing for removing high-frequency noise on each measurement value Ch_R_d(n), Ch_L_d(n) acquired in Step ST1, and then advances to Step ST3. It should be noted that, hereinafter, the value obtained by conducting the filter processing on the right measurement value Ch_R_d(n) is referred to as right filter value, and is noted as "Ch_R_f(n)". In addition, hereinafter, the value obtained by conducting the filter processing on the left measurement value Ch_L_d(n) is referred to as left filter value, and is noted as "Ch_L_f(n)". In addition, the present embodiment explains a case of the capacitance threshold setter 82 conducting weighted moving average processing such as that shown in the following Formulas (3) and (4), for example, as the filter processing on each measurement value Ch_R_d(n), Ch_L_d(n); however, the present invention is not limited thereto. Herein, in the following Formula, "w" is the weight, and is any positive value larger than 0.

$$Ch\_R\_f(n)=(Ch\_R\_d(n)+w\times Ch\_R\_f(n-1))/(1+w) \tag{3}$$

$$Ch\_L\_f(n)=(Ch\_L\_d(n)+w\times Ch\_L\_f(n-1))/(1+w) \tag{4}$$

In Step ST3, the capacitance threshold setter 82 calculates the slope a_R(n) of the right filter value Ch_R_f(n) as a parameter representing the change trend of the right filter value Ch_R_f(n) of the right measurement value, and then advances to Step ST4. More specifically, the capacitance threshold setter 82 calculates the slope a_R(n) of the right filter value Ch_R_f(n), by dividing the change amount (Ch_R_f(n)–Ch_R_f(n-1)) of the right filter value in the determination period of one cycle from n–$1^{th}$ cycle to $n^{th}$ cycle, by the length of determination period ($\Delta t$), as shown in the following Formula (5). In other words, in the case of the right filter value Ch_R_f(n) being an increasing trend, the slope a_R(n) will be a positive value, and in the case of being a decreasing trend, the slope a_R(n) will be a negative value.

$$a\_R(n)=(Ch\_R\_f(n)-Ch\_R\_f(n-1))/\Delta t \tag{5}$$

In Step ST4, the capacitance threshold setter 82 calculates the slope a_L(n) of the left filter value Ch_L_f(n) as a parameter representing the change trend of the left filter value Ch_L_f(n) of the left measurement value, and then advances to Step ST5. More specifically, the capacitance threshold setter 82 calculates the slope a_L(n) of the left filter value Ch_L_f(n), by dividing the change amount (Ch_L_f(n)–Ch_L_f(n-1)) of the left filter value in the determination period of one cycle from n–$1^{th}$ cycle to $n^{th}$ cycle, by the length of determination period ($\Delta t$), as shown in the following Formula (6). In other words, in the case of the left filter value Ch_L_f(n) being an increasing trend, the slope a_L(n) will be a positive value, and in the case of being a decreasing trend, the slope a_L(n) will be a negative value.

$$a\_L(n)=(Ch\_L\_f(n)-Ch\_L\_f(n-1))/\Delta t \tag{6}$$

In Step ST5, the capacitance threshold setter 82 calculates the similarity S(n) of varying in response to similarity degree between the change trend of the right filter value Ch_R_f(n) and the change trend of the left filter value Ch_L_f(n) by comparing the calculated slopes a_R(n), a_L(n), and then advances to Step ST6. More specifically, the capacitance threshold setter 82 calculates the similarity S(n) of the change trends of the filter values Ch_R_f(n), Ch_L_f(n) in accordance with the following Formula (7), for example. In the following Formula (7), "a0" is a coefficient of a positive value decided in advance. The similarity S(n) defined by the following Formula (7) becomes a larger value as the slopes a_R(n), a_L(n) representing the change trend of each filter value Ch_R_f(n), Ch_L_f(n) approach, i.e. as the degree of similarity of the change trends of each filter value Ch_R_f(n), Ch_L_f(n) rises. In addition, the similarity S(n) becomes a smaller value as the slopes a_R(n), a_L(n) representing the change trend of each filter value Ch_R_f(n), Ch_L_f(n) distance, i.e. as the degree of similarity of the change trend of each filter value Ch_R_f(n), Ch_L_f(n) lowers.

$$S(n)=a0/(|a\_R(n)-a\_L(n)|) \tag{7}$$

In Step ST6, the capacitance threshold setter 82 determines whether the slope a_R(n) of the right filter value Ch_R_f(n) and the slope a_L(n) of the left filter value Ch_L_f(n) are the same symbol. The capacitance threshold setter 82 advances to Step ST7 in the case of the determination result in Step ST6 being YES. In Step ST7, the capacitance threshold setter 82 determines whether the similarity S(n) is higher than a predetermined similarity reference S_th of a positive value (S(n)>S_th).

The capacitance threshold setter 82 determines that the change in each filter value Ch_R_f(n), Ch_L_f(n) during a determination period from the n–$1^{th}$ cycle to the $n^{th}$ cycle is caused by a change in position of the hand of the driver in the case of the determination result in Step ST6 being NO or a case of the determination result in Step ST7 being NO, i.e. case of the slopes a_R(n), a_L(n) being different symbols, or the similarity S(n) being no more than the similarity reference S_th. In this case, the capacitance threshold setter 82 determines that there is no need for correcting the reference value Ch_0(n), and then advances to Step ST8.

In Step ST8, the capacitance threshold setter 82 sets the reference value Ch_0(n) to a value equal to the reference value Ch_0(n-1) of the prior cycle as shown in the following Formula (8), and then returns to Step ST1. In other words, the capacitance threshold setter 82 maintains the reference value Ch_0(n) constant. It should be noted that the initial value Ch_0(0) of the reference value is set to a value equal to the smaller of either of a value decided in advance or the right measurement value Ch_R_d(0) and left measurement value Ch_L_d(0) immediately after the start of reference value setting processing shown in FIG. 3, for example.

$$Ch\_0(n)=Ch\_0(n-1) \tag{8}$$

The capacitance threshold setter 82 determines that the change in each filter value Ch_R_f(n), Ch_L_f(n) during a time from n–$1^{th}$ cycle to $n^{th}$ cycle, in the case of the determination result in Step ST7 being YES, i.e. case of the slopes a_R(n), a_L(n) being the same symbol and the similarity S(n) being higher than the similarity reference S_th. In this case, the capacitance threshold setter 82 determines there to be a need to correct the reference value Ch_0(n) according to the change in environmental state, and then advances to Step ST9.

In Step ST9, the capacitance threshold setter 82 calculates the correction value dCh_0(n) based on at least any of the slope a_R(n), a_L(n), and then advances to Step ST10. More specifically, the capacitance threshold setter 82 calculates the correction value dCh_0(n) according to the change in environmental state during the time $\Delta t$, by multiplying the time $\Delta t$ by the slope a_R(n), as shown in the following Formula (9), for example. Therefore, in the case of both of the respective filter values Ch_R_f(n), Ch_L_f(n) being an increasing trend, the correction value dCh_0(n) shall be a positive value. In addition, in the case of both of the respective filter values Ch_R_f(n), Ch_L_f(n) being a decreasing trend, the correction value dCh_0(n) shall be a negative value.

$$dCh\_0(n)=a\_R(n)\times\Delta t \tag{9}$$

It should be noted that, due to the slopes a_R(n), a_L(n) being the same symbol and being substantially equal, the correction value dCh_0(n) may be calculated by multiplying the time $\Delta t$ by the slope a_L(n), and the correction value dCh_0(n) may be calculated by multiplying the time $\Delta t$ by the average value of the slopes a_R(n), a_L(n).

In Step ST10, the capacitance threshold setter 82 sets a value arrived at by adding the correction value dCh_0(n) calculated in Step ST9 to the reference value Ch_0(n-1) of the previous period as the reference value Ch_0(n), as shown in the following Formula (10), and then returns to Step ST1. In other words, the capacitance threshold setter 82 corrects the reference value Ch_0(n) to the increasing side in the case of both of the respective filter values Ch_R_f(n), Ch_L_f(n) being an increasing trend, and corrects the reference value Ch_0(n) to the decreasing side in the case of both of the respective filter values Ch_R_f(n), Ch_L_f(n) being a decreasing trend.

$$Ch\_0(n)=Ch\_0(n-1)+dCh\_0(n) \tag{10}$$

Figure 4:
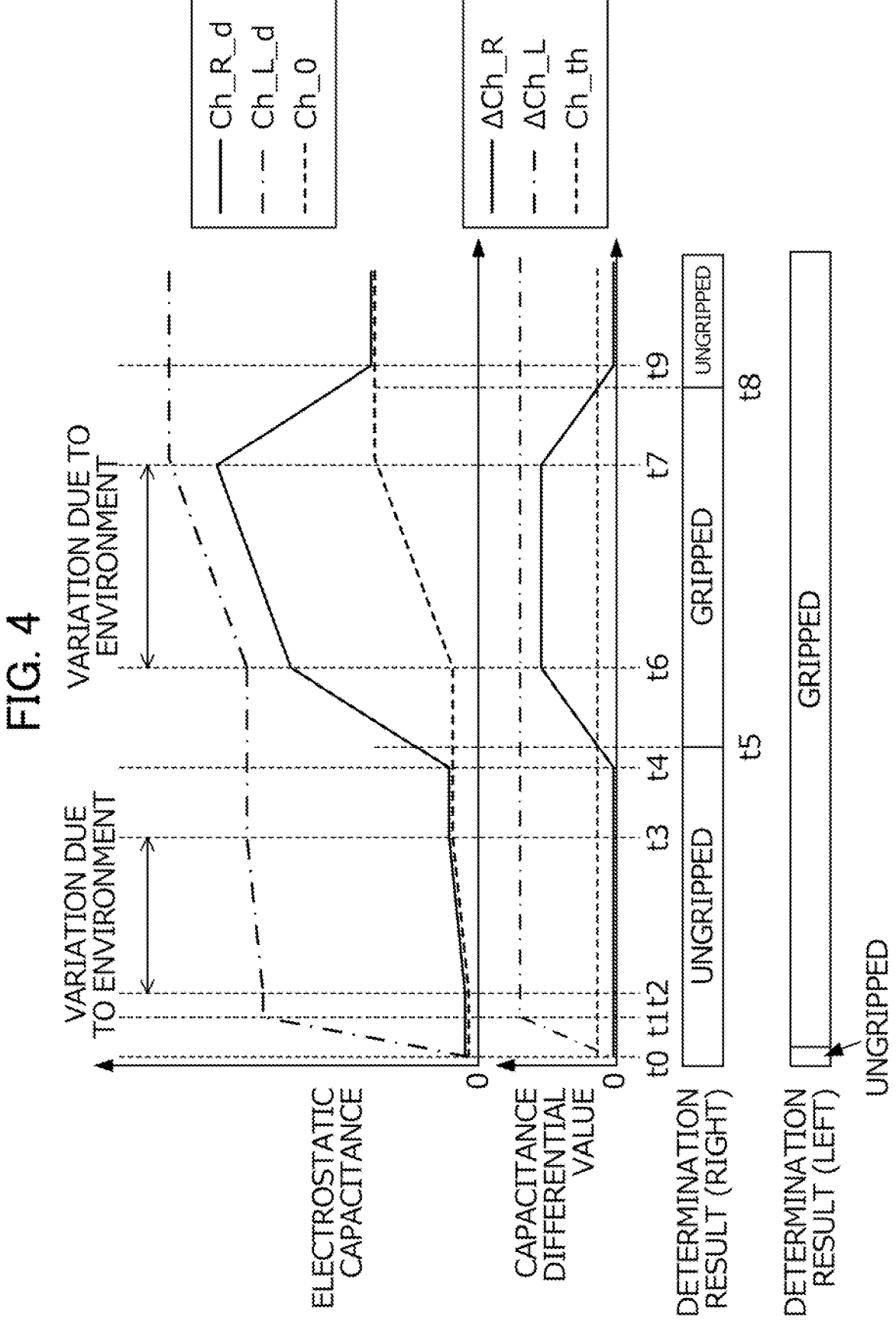
FIG. 4 is a time chart of a determination result, etc. for the presence/absence of gripping, in a case of setting the reference value by the reference value setting processing.

FIG. 4 is a time chart of the determination result, etc. for the presence/absence of gripping of the steering wheel 2 in the case of setting the reference value Ch_0 by the above such reference value setting processing. The upper part of FIG. 4 shows the right measurement value Ch_R_d (solid line), left measurement value Ch_L_d (dash-dot line) and reference value Ch_0 (dashed line), the middle part shows the right capacitance differential value ΔCh_R (solid line), left capacitance differential value ΔCh_L (dash-dot line), and grip determination threshold Ch_th (dashed line), and the lower part shows the determination result of gripping of the right grip 20R and left grip 20L. It should be noted that, in FIG. 4, the respective filter values Ch_R_f, Ch_L_f are values substantially equal to the respective measurement values Ch_R_d, Ch_L_d.

First, from times t0 to t1, the left measurement value Ch_L_d suddenly rises by the driver gripping the left grip 20L with the left hand. For this reason, from times t0 to t1, since the left capacitance differential value ΔCh_L exceeds the grip determination threshold Ch_th, the determiner 81 from then on determines the steering wheel 2 as being gripped at the left grip 20L. In addition, from times t0 to t1, the right measurement value Ch_R_d is substantially constant, and the right capacitance differential value ΔCh_R is substantially constant at a value less than the grip determination threshold Ch_th. Therefore, from times t0 to t1, the determiner 81 determines as not being gripped at the right grip 20R. In addition, since the similarity S of the change trends from times t0 to t1 of the respective measurement values Ch_R_d, Ch_L_d is less than the similarity reference S_th, the capacitance threshold setter 82 maintains the reference value Ch_0 constant (refer to Step ST8 in FIG. 3).

Next, from times t2 to t3, the environmental state around the electrodes 40 to 50 changes while the steering wheel 2 is being gripped only at the left grip 20L, whereby the respective measurement values Ch_R_d, Ch_L_d both rise at substantially the same slope. Therefore, since the similarity S of the change trends between times t2 to t3 of the respective measurement values Ch_R_d, Ch_L_d is at least the similarity reference S_th, the capacitance threshold setter 82 corrects the reference value Ch_0 to the increasing side following the increase in the respective measurement values Ch_R_d, Ch_L_d (refer to Steps ST9 and ST10 in FIG. 3). For this reason, between times t2 and t3, the respective capacitance differential values ΔCh_R, ΔCh_L are maintained substantially constant irrespective of the change in environmental state. In particular, between times t2 and t3, by correcting the reference value Ch_0 to the increasing side following the increase in the right measurement value Ch_R_d, it is possible to maintain the right capacitance differential value ΔCh_R constant at a value less than the grip determination threshold Ch_th. For this reason, it is possible to prevent the determiner 81 from misjudging as the right grip 20R being gripped between times t2 and t3.

Next, from times t4 to t6, the right measurement value Ch_R_d suddenly rises by the driver gripping the right grip 20R. For this reason, at time t5, since the right capacitance differential value ΔCh_R exceeds the grip determination threshold Ch_th, from there on the determiner 81 determines that the steering wheel 2 is being gripped at the left and right grips 20R, 20L. In addition, from times t4 to t6, since the driver still grips the left grip 20L, the left measurement value Ch_L_d is substantially constant. Therefore, since the similarity S of the change trends between times t4 and t6 of the respective measurement values Ch_R_d, Ch_L_d is less than the similarity reference S_th, the capacitance threshold setter 82 maintains the reference value Ch_0 constant (refer to Step ST8 in FIG. 3).

Next, from times t6 to t7, the respective measurement values Ch_R_d, Ch_L_d both rise at substantially the same slope, by the environmental state around the electrodes 40, 50 changing in a state in which the steering wheel 2 is being gripped at both the left and right grips 20R, 20L. Therefore, since the similarity S of the change trends between times t6 and t7 of the respective measurement values Ch_R_d, Ch_L_d is at least the similarity reference S_th, the capacitance threshold setter 82 corrects the reference value Ch_0 to the increasing side following the increase in the respective measurement values Ch_R_d, Ch_L_d (refer to Steps ST9 to ST0 in FIG. 3). For this reason, from times t6 to t7, the respective capacitance differential values ΔCh_R, ΔCh_L are substantially constant irrespective of the change in environmental state.

Next, from times t7 to t9, the right measurement value Ch_R_d suddenly declines by the driver distancing the right hand from the right grip 20R. For this reason, at time t8, the capacitance differential value ΔCh_R falls below the grip determination threshold Ch_th. For this reason, from time t8 and after, the determiner 81 determines that the steering wheel 2 is not being gripped at the right grip 20R. In addition, between times t7 and t8, since the driver is still gripping the left grip 20L, the left measurement value Ch_L_d is substantially constant. Therefore, since the similarity S of the change trends between times t7 and t9 of the respective measurement values Ch_R_d, Ch_L_d is less than the similarity reference S_th, the capacitance threshold setter 82 maintains the reference value Ch_0 constant (refer to Step ST8 in FIG. 3).

In the above way, the capacitance threshold setter 82 can change the reference value Ch_0 in response to variation in the environmental state around the electrodes 40, 50, by varying the reference value Ch_0 following variation in the respective measurement values Ch_R_d, Ch_L_d, only in a period in which the similarity S of the change trends of the respective measurement values Ch_R_d, Ch_L_d is higher than the similarity reference S_th (period of times t2 to t3 and period of times t6 to 7 in the example of FIG. 4).

In the above way, in the present embodiment, although the necessity for correction of the reference value Ch_0(n) was judged based on the degree of similarity in change trends of the respective filter values Ch_R_f(n), Ch_L_f(n) during the determination period of one control cycle Δt from the n−1th cycle to the nth cycle; however, the length of the determination period is not limited thereto. The determination period may be set as several cycles Δt×m (m is an integer of 2 or greater).

In addition, with the reference value setting processing shown in FIG. 3, although the necessity for correction of the reference value Ch_0(n) was judged based on the degree of similarity in change trends of the respective filter values Ch_R_f(n), Ch_L_f(n), the present invention is not limited thereto. The capacitance threshold setter 82 may judge the necessity for correction of the reference value Ch_0(n) based on the degree of similarity in change trends of the measurement values Ch_R_d(n), Ch_L_d(n) prior to conducting the filter processing.

In addition, the present embodiment explains a case of the determiner 81 determining the presence/absence of gripping of the right grip 20R of the steering wheel 2 by the driver based on the above Formulas (1-1) and (1-2); however, the present invention is not limited thereto. The determiner 81 may determine the presence/absence of gripping of the steering wheel 2 by the driver based on the following Formulas (11-1) and (11-2) equivalent to the above Formulas (1-1) and (1-2). In other words, the determiner 81 may determine that the steering wheel 2 is being gripped by the driver at the right grip 20R, in the case of the sum of the grip determination threshold Ch_th and the reference value Ch_0 being no more than the measurement value Ch_R_d, i.e. case of the following Formula (11-1) holding true, and may determine that the steering wheel 2 is being gripped by the driver at the right grip 20R in the case of the sum of the grip determination threshold Ch_th and the reference value Ch_0 being greater than the measurement value Ch_R_d, i.e. case of the following Formula (11-2) holding true. It should be noted that, since the determination of the presence/absence of gripping of the left grip 20L is similar, a detailed explanation will be omitted.

$$Ch\_R\_d \geq Ch\_th + Ch\_0 \tag{11-1}$$

$$Ch\_R\_d < Ch\_th + Ch\_0 \tag{11-2}$$

According to the steering device 1 related to the present embodiment, the following effects are exerted.

(1) The grip determination device 80 of the steering device 1 includes the plurality of proximity sensors 4, 5 having different installation positions of the electrodes 40, 50 on the steering wheel 2; and the grip determination device 80 which determines the presence/absence of gripping of the steering wheel 2 based on the measurement values Ch_R_d, Ch_L_d from the plurality of proximity sensors 4, 5. In addition, the detection target regions are established for every proximity sensor 4, 5 on the steering wheel 2, and the grip determination device 80 includes the capacitance threshold setter 82 which sets the reference value Ch_0 for electrostatic capacitance of the electrodes 40, 50; and the determiner 81 which determines the presence/absence of gripping for every detection target region based on the difference between the measure values Ch_R_d, Ch_L_d and the reference value Ch_0. Herein, when the driver grips the steering wheel 2 at any of the plurality of detection target regions, the measurement values Ch_R_d, Ch_L_d of the proximity sensors 4, 5 establishing this gripped region as the detection target region increase, and thus the difference between the measurement values Ch_R_d, Ch_L_d and the reference value Ch_0 also increases. For this reason, the steering device 1 can determine the presence/absence of gripping for every detection target region based on the difference between the measurement values Ch_R_d, Ch_L_d and the reference value Ch_0. Herein, when the environmental state around the steering wheel 2 changes, since the measurement values Ch_R_d, Ch_L_d of the electrostatic capacitance from these proximity sensors 4, 5 also change, it is necessary to appropriately correct the reference value Ch_0 according to the change in environmental state in order to suppress misjudgment caused by the change in environmental state. In addition, since the plurality of electrodes 40, 50 are under substantially the same environment, the change trends of the measurement values Ch_R_d, Ch_L_d of the respective proximity sensors 4, 5 due to a change in environmental state will be similar. Therefore, the capacitance threshold setter 82 can correct the reference value Ch_0 at the appropriate timing, by dividing the cause for change in the measurement values Ch_R_d, Ch_L_d into being due to change in the position of the hand of the driver and due to change in environmental state, by determining the necessity for correction of the reference value Ch_0 based on the degree of similarity in the change trends of the filter values Ch_R_f, Ch_L_f of the measurement values of the plurality of proximity sensors 4, 5. Consequently, according to the steering device 1, since it is possible to make the difference between the measurement value Ch_R_d, Ch_L_d and reference value Ch_0 constant irrespective of the change in environmental state around the steering wheel 2, it is possible to prevent misjudgment due to variation in the environmental state around the steering wheel 2, and thus it is possible to contribute to the development of a sustainable transportation system. In addition, with the steering device 1, since there is no need to provide a sensor for detecting the environmental state around the steering wheel 2, it is possible to prevent misjudgment with a simpler configuration than conventional.

(2) The capacitance threshold setter 82 calculates the similarity S(n) which varies according to the degree of similarity in change trends of the filter values Ch_R_f(n), Ch_L_f(n), and in the case of this similarity S(n) being higher than the similarity reference S_th, i.e. case of the change trends of each filter value Ch_R_f(n), Ch_L_f(n) of the plurality of proximity sensors 4, 5 being similar, corrects the reference value Ch_0 with the change in these filter values Ch_R_f(n), Ch_L_f(n) as being due to change in the environmental state, and in the case of the similarity S(n) being lower than the similarity reference S_th, maintains the reference value Ch_0 constant with the change in these filter values Ch_R_f(n), Ch_L_f(n) as being due to the position of the hand of the driver changing. Consequently, according to the steering device 1, since it is possible to remove only the variation amount due to the change in environmental state from the capacitance differential values ΔCh_R, ΔCh_L, it is possible to prevent misjudgment due to variation in the environmental state around the steering wheel 2.

(3) The capacitance threshold setter 82 calculates the similarity S(n) by comparing the slopes a_R(n), a_L(n) of the respective filter values Ch_R_f(n), Ch_L_f(n) of the plurality of proximity sensors 4, 5. Consequently, according to the steering device 1, it is possible to calculate the similarity S(n) of change trends of the respective filter values Ch_R_f(n), Ch_L_f(n) by a simple computation.

(4) The capacitance threshold setter 82 corrects the reference value Ch_0(n) to the increasing side, in the case of the similarity S(n) of change trends of the plurality of filter values Ch_R_f(n), Ch_L_f(n) being higher than the similarity reference S_th, and both of the plurality of filter values Ch_R_f(n), Ch_L_f(n) being an increasing trend, and corrects the reference value Ch_0 to the decreasing side in the case of the similarity S(n) of change trends of the plurality of filter values Ch_R_f(n), Ch_L_f(n) being higher than the similarity reference S_th, and both of the plurality of filter values Ch_R_f(n), Ch_L_f(n) being a decreasing trend. Since it is thereby possible to make the capacitance differential values ΔCh_R, ΔCh_L constant irrespective of the change in environmental state, it is possible to prevent misjudgment.

(5) The determiner 81 determines the presence/absence of gripping of the steering wheel 2 based on the capacitance differential values ΔCh_R, ΔCh_L obtained by subtracting the reference value Ch_0(n) from the measurement values Ch_R_d(n), Ch_L_d(n). Consequently, according to the steering device 1, since it is possible to make the capacitance differential values ΔCh_R, ΔCh_L constant irrespective of a change in environmental state around the steering wheel 2, it is possible to determine the presence/absence of gripping precisely.

In the above way, in the present embodiment, the capacitance threshold setter 82 calculates the similarity S(n) by comparing the slopes a_R(n), a_L(n) of the respective filter values Ch_R_f(n), Ch_L_f(n) of the plurality of proximity sensors 4, 5; however, the present invention is not limited thereto. The capacitance threshold setter 82 may calculate the change amounts dCh_R_f(n), dCh_L_f(n) in a predetermined determination period (for example, from $n-1^{th}$ cycle to $n^{th}$ cycle) of each filter value Ch_R_f(n), Ch_L_f(n) of the plurality of proximity sensors 4, 5 in accordance with the following Formulas (12) and (13), and may calculate the similarity S(n) by comparing these change amounts dCh_R_f(n), dCh_L_f(n).

$$dCh\_R\_f(n) = Ch\_R\_f(n) - Ch\_R\_f(n-1) \qquad (12)$$

$$dCh\_L\_f(n) = Ch\_L\_f(n) - Ch\_L\_f(n-1) \qquad (13)$$

In this case, the capacitance threshold setter 82 calculates the similarity S(n) in accordance with the following Formula (14), for example. In the following Formula (14), "a1" is a positive coefficient decided in advance. The similarity S(n) defined by the following Formula (14) becomes a larger value as the change amounts dCh_R_f(n), dCh_L_f(n) representing the change trend of the respective filter values Ch_R_f(n), Ch_L_f(n) become closer, i.e. as the degree of similarity of the change trend of the respective filter values Ch_R_f(n), Ch_L_f(n) becomes higher. In addition, the similarity S(n) becomes a smaller value as the change amounts dCh_R_f(n), dCh_L_f(n) representing the change trend of the respective filter values Ch_R_f(n), Ch_L_f(n) become farther, i.e. as the degree of similarity of the change trend of the respective filter values Ch_R_f(n), Ch_L_f(n) becomes lower.

$$S(n) = a1/(|dCh\_R\_f(n) - dCh\_L\_f(n)|) \qquad (14)$$

In addition, the present embodiment explains a case of the capacitance threshold setter 82 making the grip determination threshold Ch_th constant and changing the reference value Ch_0 in response to variation in the environmental state; however, the present invention is not limited thereto. The capacitance threshold setter 82 may make the reference value Ch_0 constant and change the grip determination threshold Ch_th in response to variation in the environmental state. It should be noted that, at this time, since the timing and width of changing the grip determination threshold Ch_th are the same as the timing and width of changing the reference value Ch_0 in the reference value setting processing shown in FIG. 3, a detailed explanation is omitted. In this case, since it is possible to make the difference between the capacitance differential value ΔCh and grip determination threshold Ch_th irrespective of change in the environmental state around the steering wheel 2, it is possible to determine the presence/absence of gripping precisely similar to the above-mentioned embodiment.

What is claimed is:

1. A steering device comprising:

a steering wheel which accepts a steering operation of a vehicle from a driver;

a measurement device which measures an electrostatic capacitance of an electrode provided to the steering wheel;

a plurality of the measurement devices having different installation positions of the electrodes; and a grip determination device which determines a presence/absence of gripping of the steering wheel based on a measurement value from a plurality of the measurement devices, wherein a detection target region is established for every one of the measurement devices on the steering wheel, wherein the grip determination device includes a capacitance threshold setter which sets a capacitance threshold for electrostatic capacitance of the electrode, and a determiner which determines a presence/absence of gripping for every one of the detection target regions based on a difference or comparison between the measurement value and the capacitance threshold, and wherein the capacitance threshold setter determines a necessity for correction of the capacitance threshold based on a degree of similarity in change trends of measurement values during a same period of the plurality of the measurement devices, each with different detection target regions.

2. The steering device according to claim 1, wherein the capacitance threshold setter calculates a similarity which fluctuates in response to the degree of similarity, and corrects the capacitance threshold in a case of the similarity being higher than a predetermined similarity reference, and maintains the capacitance threshold constant, in a case of the similarity being lower than the similarity reference.

3. The steering device according to claim 2, wherein the capacitance threshold setter calculates the similarity by comparing a slope of each measurement value of a plurality of the measurement devices.

4. The steering device according to claim 2, wherein the capacitance threshold setter calculates the similarity by comparing a change amount in a predetermined determination period of each measurement value of a plurality of the measurement devices.

5. The steering device according to claim 2, wherein the capacitance threshold setter corrects the capacitance threshold to an increasing side in a case of all measurement values of a plurality of the measurement devices being an increasing trend, and corrects the capacitance threshold to a decreasing side in a case of all measurement values of a plurality of the measurement devices being a decreasing trend.

6. The steering device according to claim 5, wherein the determiner determines a presence/absence of gripping of the steering wheel based on a capacitance differential value obtained by subtracting a reference value which is the capacitance threshold from the measurement value.

7. The steering device according to claim 6, wherein the determiner determines a presence/absence of gripping of the steering wheel by comparing between the measurement value and a grip determination threshold which is the capacitance threshold.

8. The steering device according to claim 3, wherein the capacitance threshold setter corrects the capacitance threshold to an increasing side in a case of all measurement values of a plurality of the measurement devices being an increasing trend, and corrects the capacitance threshold to a decreasing side in a case of all measurement values of a plurality of the measurement it devices being a decreasing trend.

9. The steering device according to claim 8, wherein the determiner determines a presence/absence of gripping of the steering wheel based on a capacitance differential value obtained by subtracting a reference value which is the capacitance threshold from the measurement value.

10. The steering device according to claim 8, wherein the determiner determines a presence/absence of gripping of the steering wheel by comparing between the measurement value and a grip determination threshold which is the capacitance threshold.

11. The steering device according to claim 3, wherein the capacitance threshold setter corrects the capacitance threshold to an Increasing side in a case of all measurement values of a plurality of the measurement devices being an increasing trend, and corrects the capacitance threshold to a decreasing side in a case of all measurement values of a plurality of the measurement devices being a decreasing trend.

12. The steering device according to claim 11, wherein the determiner determines presence/absence of gripping of the steering wheel based on a capacitance differential value obtained by subtracting a reference value which is the capacitance threshold from the measurement value.

13. The steering device according to claim 11, wherein the determiner determines a presence/absence of gripping of the steering wheel by comparing between the measurement value and a grip determination threshold which is the capacitance threshold.

\* \* \* \* \*